US012671386B2

(12) United States Patent
Nagatomo

(10) Patent No.: US 12,671,386 B2
(45) Date of Patent: Jun. 30, 2026

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 821 days.

(21) Appl. No.: 18/104,362

(22) Filed: Feb. 1, 2023

(65) Prior Publication Data

US 2023/0170873 A1 Jun. 1, 2023

Related U.S. Application Data

(63) Continuation of application No. PCT/JP2022/030014, filed on Aug. 4, 2022.

(Continued)

(51) Int. Cl.
*H03H 9/00* (2006.01)
*H03H 9/02* (2006.01)
(Continued)

(52) U.S. Cl.
CPC .... *H03H 9/02086* (2013.01); *H03H 9/02031* (2013.01); *H03H 9/13* (2013.01); *H03H 9/173* (2013.01)

(58) Field of Classification Search
CPC .......... H03H 9/02086; H03H 9/02031; H03H 9/13; H03H 9/173; H03H 9/02015; H03H 9/02228
See application file for complete search history.

(56) References Cited

U.S. PATENT DOCUMENTS

2003/0214372 A1 11/2003 Miura et al.
2022/0029601 A1 1/2022 Nagatomo
(Continued)

FOREIGN PATENT DOCUMENTS

JP 2003332880 A 11/2003
JP 2012257019 A 12/2012
(Continued)

OTHER PUBLICATIONS

International Search Report in PCT/JP2022/030014, mailed Nov. 1, 2022, 3 pages.
(Continued)

*Primary Examiner* — Julio C. Gonzalez
(74) *Attorney, Agent, or Firm* — Keating & Bennett, LLP

(57) ABSTRACT

An acoustic wave device includes a support with a thickness in a first direction, a piezoelectric layer extending on the support in the first direction, and an interdigital transducer electrode on a principal surface of the piezoelectric layer. The interdigital transducer electrode includes first electrode fingers extending in a second direction crossing the first direction, a first busbar electrode connected to the first electrode fingers, second electrode fingers extending in the second direction and facing corresponding ones of the first electrode fingers in a third direction perpendicular or substantially perpendicular to the second direction, and a second busbar electrode connected to the second electrode fingers. The piezoelectric layer includes a piezoelectric multilayer structure in a gap region between at least one first electrode finger and the second busbar electrode, or between at least one second electrode finger and the first busbar electrode, in plan view in the first direction. The piezoelectric multilayer structure includes first and second piezoelectric bodies with different dielectric polarizations.

20 Claims, 15 Drawing Sheets

Related U.S. Application Data

(60) Provisional application No. 63/229,082, filed on Aug. 4, 2021.

(51) Int. Cl.
H03H 9/13 (2006.01)
H03H 9/17 (2006.01)

(56) References Cited

U.S. PATENT DOCUMENTS

| | | | | |
|---|---|---|---|---|
| 2022/0302897 | A1 | 9/2022 | Daimon | |
| 2024/0275359 | A1* | 8/2024 | Iwamoto | H03H 9/02559 |
| 2024/0313741 | A1* | 9/2024 | Nagatomo | H03H 9/105 |

FOREIGN PATENT DOCUMENTS

| | | | |
|---|---|---|---|
| JP | 2014110457 A | 6/2014 |
| JP | 2019021997 A | 2/2019 |
| WO | 2020209359 A1 | 10/2020 |
| WO | 2021125013 A1 | 6/2021 |

OTHER PUBLICATIONS

Written Opinion in PCT/JP2022/030014, mailed Nov. 1, 2022, 3 pages.

* cited by examiner

ACOUSTIC WAVE DEVICE

CROSS REFERENCE TO RELATED APPLICATIONS

This application claims the benefit of priority to Provisional Patent Application No. 63/229,082 filed on Aug. 4, 2021 and is a Continuation Application of PCT Application No. PCT/JP2022/030014 filed on Aug. 4, 2022. The entire contents of each application are hereby incorporated herein by reference.

BACKGROUND OF THE INVENTION

1. Field of the Invention

The present disclosure relates to an acoustic wave device.

2. Description of the Related Art

An acoustic wave device is disclosed in Japanese Unexamined Patent Application Publication No. 2012-257019.

SUMMARY OF THE INVENTION

The acoustic wave device described in Japanese Unexamined Patent Application Publication No. 2012-257019 has the possibility of leakage of acoustic waves in a direction in which electrode fingers extend.

Preferred embodiments of the present invention reduce or prevent leakage of acoustic waves.

An acoustic wave device according to an aspect of a preferred embodiment of the present invention includes a support including a support substrate with a thickness in a first direction, a piezoelectric layer extending in the first direction of the support, and an interdigital transducer (IDT) electrode on a principal surface of the piezoelectric layer. The interdigital transducer electrode includes a plurality of first electrode fingers extending in a second direction crossing the first direction, a first busbar electrode connected to the plurality of first electrode fingers, a plurality of second electrode fingers extending in the second direction and facing corresponding ones of the plurality of first electrode fingers in a third direction perpendicular or substantially perpendicular to the second direction, and a second busbar electrode connected to the plurality of second electrode fingers. The piezoelectric layer includes a piezoelectric multilayer structure in a gap region between at least one first electrode finger and the second busbar electrode, or between at least one second electrode finger and the first busbar electrode, in plan view in the first direction. The piezoelectric multilayer structure includes a first piezoelectric body and a second piezoelectric body with different dielectric polarizations.

Preferred embodiments of the present disclosure can reduce or prevent leakage of acoustic waves.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present disclosure will now be described in detail on the basis of the drawings. Note that the preferred embodiments described below do not limit the present disclosure. The preferred embodiments of the present disclosure are presented for illustrative purposes. In modifications and a second preferred embodiment where some components of different preferred embodiments can be replaced or combined, the description of matters common to the first preferred embodiment will be omitted and differences alone will be described. In particular, the same advantageous effects achieved by the same configurations will not be mentioned in the description of each preferred embodiment.

First Preferred Embodiment

Figure 1A:
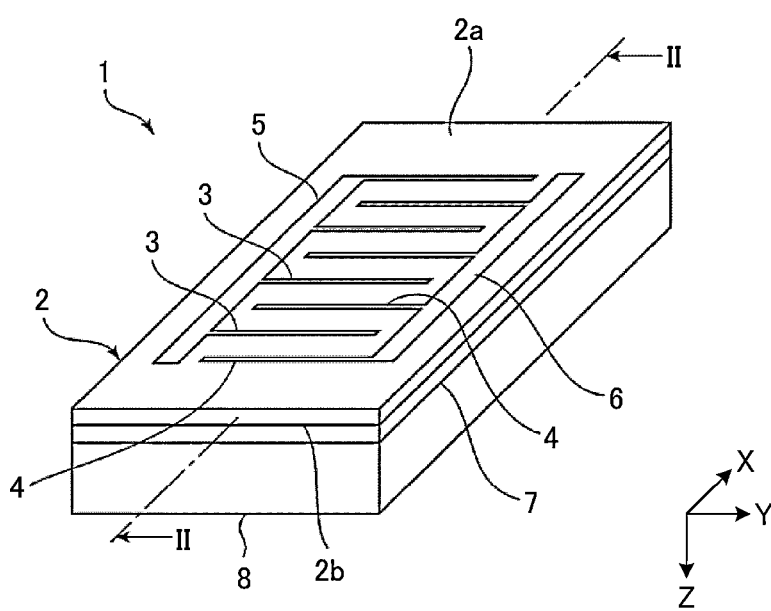
FIG. 1A is a perspective view of an acoustic wave device according to a first preferred embodiment of the present invention.
Figure 1B:
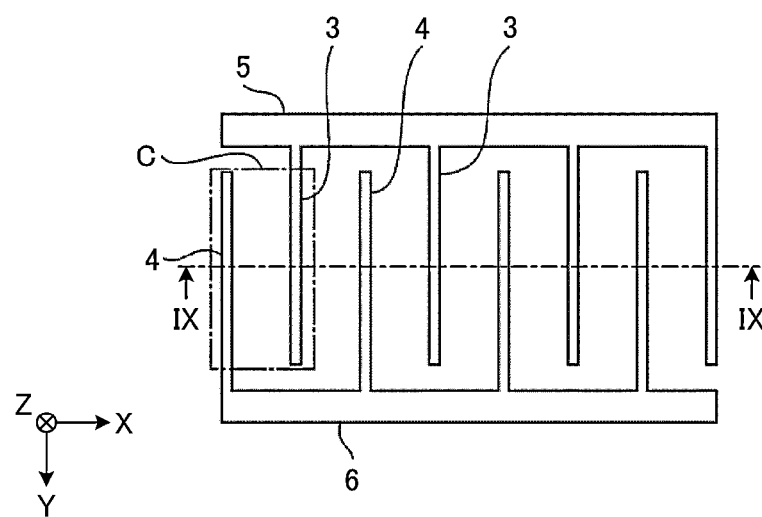
FIG. 1B is a plan view of an electrode structure according to a first preferred embodiment of the present invention.

FIG. 1A is a perspective view of an acoustic wave device according to a first preferred embodiment. FIG. 1B is a plan view of an electrode structure according to the first preferred embodiment.

An acoustic wave device 1 according to the first preferred embodiment includes a piezoelectric layer 2 made of $LiNbO_3$. The piezoelectric layer 2 may be made of $LiTaO_3$. The cut-angles of $LiNbO_3$ and $LiTaO_3$ are Z-cut in the first preferred embodiment. The cut-angles of $LiNbO_3$ and $LiTaO_3$ may be rotated Y-cut or X-cut. It is preferable that the propagation orientation be Y-propagation and X-propagation $\pm 30°$.

The thickness of the piezoelectric layer 2 is not particularly limited. For effective excitation of first-order thickness shear mode, the thickness of the piezoelectric layer 2 is preferably greater than or equal to about 50 nm and less than or equal to about 1000 nm, for example.

The piezoelectric layer 2 includes a first principal surface 2a and a second principal surface 2b opposite each other in the Z direction. Electrode fingers 3 and 4 are arranged on the first principal surface 2a.

Here, the electrode finger 3 is an example of "first electrode finger", and the electrode finger 4 is an example of "second electrode finger". In FIG. 1A ad FIG. 1B, a plurality of electrode fingers 3 are a plurality of "first electrodes" connected to a first busbar electrode 5. A plurality of electrode fingers 4 are a plurality of "second electrodes" connected to a second busbar electrode 6. The plurality of electrode fingers 3 and the plurality of electrode fingers 4 are interdigitated with each other. The electrode fingers 3, the electrode fingers 4, the first busbar electrode 5, and the second busbar electrode 6 thus define an interdigital transducer (IDT) electrode.

The electrode fingers 3 and 4 are rectangular or substantially rectangular in shape and have a length direction. In a direction orthogonal to the length direction, adjacent ones of the electrode fingers 3 and 4 face each other. Both the length direction of the electrode fingers 3 and 4 and the direction orthogonal to the length direction of the electrode fingers 3 and 4 are directions that cross the thickness direction of the piezoelectric layer 2. Therefore, adjacent ones of the electrode fingers 3 and 4 can also be considered facing each other in the direction crossing the thickness direction of the piezoelectric layer 2. Hereinafter, the thickness direction of the piezoelectric layer 2 may be described as a Z direction (or first direction), the length direction of the electrode fingers 3 and 4 may be described as a Y direction (or second direction), and the direction orthogonal to the electrode fingers 3 and 4 may be described as an X direction (or third direction).

The length direction of the electrode fingers 3 and 4 may be interchanged with the direction orthogonal to the length direction of the electrode fingers 3 and 4 illustrated in FIG. 1A and FIG. 1B. That is, the electrode fingers 3 and 4 may extend in the direction in which the first busbar electrode 5 and the second busbar electrode 6 extend in FIG. 1A and FIG. 1B. In this case, the first busbar electrode 5 and the second busbar electrode 6 extend in the direction in which the electrode fingers 3 and 4 extend in FIG. 1A and FIG. 1B. A plurality of pairs of adjacent electrode fingers 3 and 4, the electrode finger 3 being connected to one potential and the electrode finger 4 being connected to the other potential, are arranged in the direction orthogonal to the length direction of the electrode fingers 3 and 4.

Here, the electrode fingers 3 and 4 adjacent to each other are not in direct contact, but are spaced from each other. The electrode fingers 3 and 4 adjacent to each other are not provided with other electrodes (including other electrode fingers 3 and 4) connected to hot and ground electrodes therebetween. The number of pairs of adjacent electrode fingers 3 and 4 does not necessarily need to be an integer, and there may be, for example, 1.5 pairs or 2.5 pairs.

A center-to-center distance, or pitch, between the electrode fingers 3 and 4 is preferably greater than or equal to about 1 μm and less than or equal to about 10 μm, for example. The center-to-center distance between the electrode fingers 3 and 4 is a distance from the center of the width dimension of the electrode finger 3 in the direction orthogonal to the length direction of the electrode finger 3 to the center of the width dimension of the electrode finger 4 in the direction orthogonal to the length direction of the electrode finger 4.

When the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance between the electrode fingers 3 and 4 is the average of the center-to-center distances between adjacent ones of the greater than or equal to 1.5 pairs of electrode fingers 3 and 4.

The width of the electrode fingers 3 and 4, or the dimension of the electrode fingers 3 and 4 in the direction in which the electrode fingers 3 and 4 face each other, is preferably greater than or equal to about 150 nm and less than or equal to about 1000 nm, for example. The center-to-center distance between the electrode fingers 3 and 4 is a distance from the center of the dimension (width dimension) of the electrode finger 3 in the direction orthogonal to the length direction of the electrode finger 3 to the center of the dimension (width dimension) of the electrode finger 4 in the direction orthogonal to the length direction of the electrode finger 4.

In the first preferred embodiment, where a Z-cut piezoelectric layer is used, the direction orthogonal to the length direction of the electrode fingers 3 and 4 is a direction orthogonal to the polarization direction of the piezoelectric layer 2. This is not applicable when a piezoelectric body with other cut-angles is used as the piezoelectric layer 2. Here, the term "orthogonal" may refer not only to being exactly orthogonal, but also to being substantially orthogonal (e.g., the angle between the direction orthogonal to the length direction of the electrode fingers 3 and 4 and the polarization direction is about 90°±10°, for example).

Figure 2:
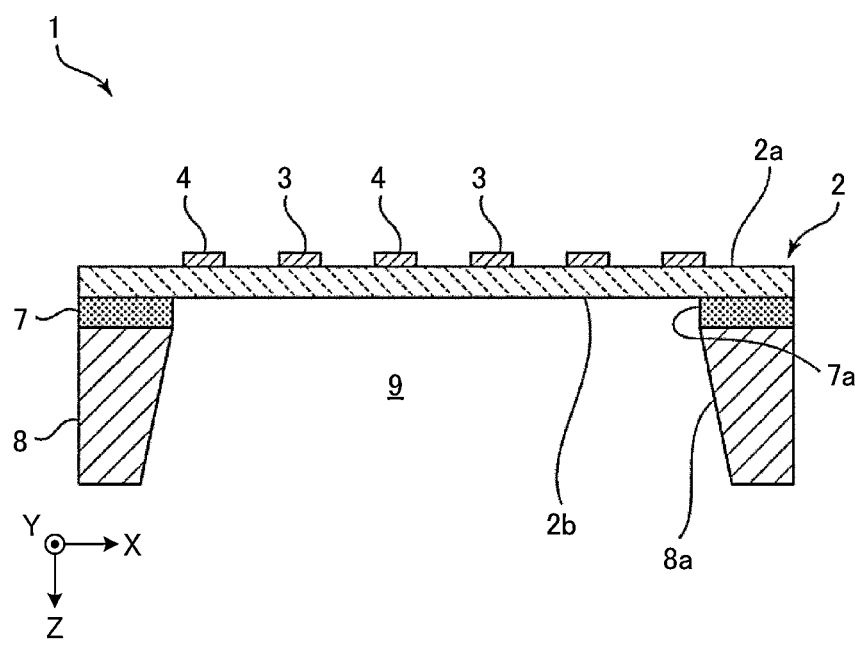
FIG. 2 is a cross-sectional view taken along line II-II of FIG. 1A.

A support substrate 8 is disposed adjacent to the second principal surface 2b of the piezoelectric layer 2, with an intermediate layer 7 interposed therebetween. The intermediate layer 7 and the support substrate 8 have a frame shape or substantially a frame shape. As illustrated in FIG. 2, the intermediate layer 7 and the support substrate 8 are provided with cavities 7a and 8a, respectively, which define an air gap 9.

The air gap 9 is structured to allow vibration of an excitation region C of the piezoelectric layer 2. Therefore, the support substrate 8 is disposed adjacent to the second principal surface 2b, with the intermediate layer 7 interposed therebetween, so as not to overlap at least one pair of electrode fingers 3 and 4. The intermediate layer 7 is optional. That is, the support substrate 8 may be disposed on the second principal surface 2b of the piezoelectric layer 2, either directly or indirectly.

The intermediate layer 7 may be made of silicon oxide, for example. The intermediate layer 7 can be made of an appropriate insulating material, such as silicon nitride or alumina, other than silicon oxide.

The support substrate 8 may be made of Si, for example. The plane orientation of the Si substrate on the surface thereof adjacent to the piezoelectric layer 2 may be (100), (110), or (111). It is preferable that the Si be a high-resistance Si with a resistivity of greater than or equal to about 4 kΩ. The support substrate 8 can also be made of an appropriate insulating material or semiconductor material. Examples of the material used to form the support substrate 8 include piezoelectric materials, such as aluminum oxide, lithium tantalate, lithium niobate, and crystals; various ceramics, such as alumina, magnesia, sapphire, silicon nitride, aluminum nitride, silicon carbide, zirconia, cordierite, mullite, steatite, and forsterite; dielectrics, such as diamond and glass; and a semiconductor, such as gallium nitride.

The plurality of electrode fingers 3 and 4, the first busbar electrode 5, and the second busbar electrode 6 are made of an appropriate metal, such as Al, or an appropriate alloy, such as AlCu alloy. In the first preferred embodiment, the electrode fingers 3 and 4, the first busbar electrode 5, and the second busbar electrode 6 have a multilayer structure of a Ti film and an Al film on the Ti film. The Ti film may be replaced by a different adhesion layer.

To drive the acoustic wave device 1, an alternating-current voltage is applied between the plurality of electrode fingers 3 and the plurality of electrode fingers 4. More specifically, an alternating-current voltage is applied between the first busbar electrode 5 and the second busbar electrode 6. This can produce resonance characteristics using first-order thickness shear mode bulk waves excited in the piezoelectric layer 2.

In the acoustic wave device 1, d/p is less than or equal to about 0.5, for example, where d is the thickness of the piezoelectric layer 2 and p is the center-to-center distance between any adjacent electrode fingers 3 and 4 of the plurality of pairs of electrode fingers 3 and 4. This allows effective excitation of the first-order thickness shear mode bulk waves and can produce good resonance characteristics. It is more preferable that d/p be less than or equal to about 0.24, for example. This produces better resonance characteristics.

As in the first preferred embodiment, when the electrode fingers 3 and 4 include at least a plurality of electrode fingers 3 or a plurality of electrode fingers 4 (i.e., there are greater than or equal to 1.5 electrode pairs, each including the electrode finger 3 and the electrode finger 4), the center-to-center distance p between the adjacent electrode fingers 3 and 4 is the average center-to-center distance between all adjacent electrode fingers 3 and 4.

In the acoustic wave device 1 of the first preferred embodiment configured as described above, the Q factor does not decrease easily even if the number of pairs of the electrode fingers 3 and 4 is reduced for the purpose of size reduction. This is because the acoustic wave device 1 is a resonator that does not require reflectors on both sides, and thus does not suffer significant propagation loss. The acoustic wave device 1 does not require reflectors, because of the use of the first-order thickness shear mode bulk waves.

Figure 3A:
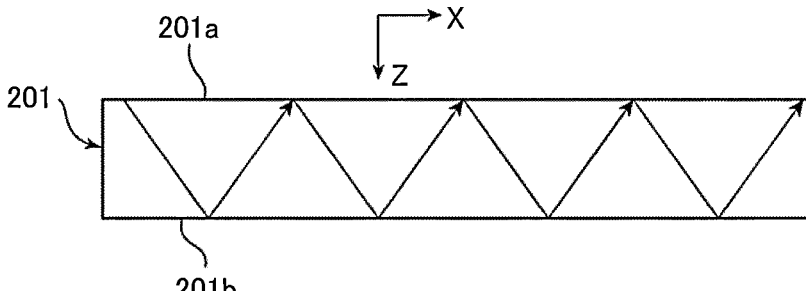
FIG. 3A is a schematic cross-sectional view for explaining Lamb waves propagating in a piezoelectric layer of a Comparative Example.
Figure 3B:
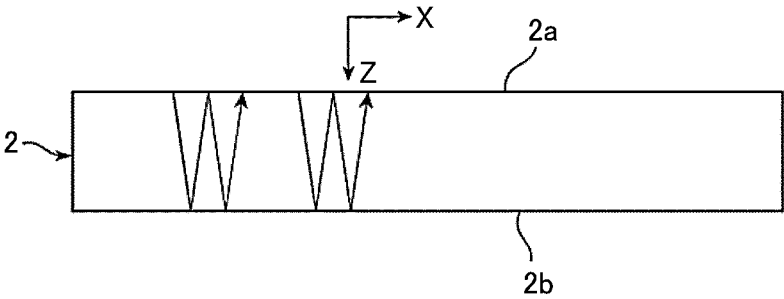
FIG. 3B is a schematic cross-sectional view for explaining first-order thickness shear mode bulk waves propagating in a piezoelectric layer of the first preferred embodiment of the present invention.
Figure 4:
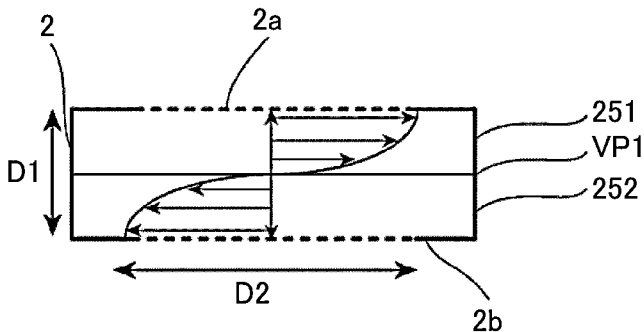
FIG. 4 is a schematic cross-sectional view for explaining an amplitude direction of first-order thickness shear mode bulk waves propagating in the piezoelectric layer of the first preferred embodiment of the present invention.

FIG. 3A is a schematic cross-sectional view for explaining Lamb waves propagating in a piezoelectric layer of Comparative Example. FIG. 3B is a schematic cross-sectional view for explaining first-order thickness shear mode bulk waves propagating in the piezoelectric layer of the first preferred embodiment. FIG. 4 is a schematic cross-sectional view for explaining an amplitude direction of first-order thickness shear mode bulk waves propagating in the piezoelectric layer of the first preferred embodiment.

In FIG. 3A, Lamb waves propagate in a piezoelectric layer of an acoustic wave device, such as that described in Japanese Unexamined Patent Application Publication No. 2012-257019. As illustrated in FIG. 3A, the waves propagate in a piezoelectric layer 201 as indicated by arrows. The piezoelectric layer 201 includes a first principal surface 201a and a second principal surface 201b. A thickness direction, which connects the first principal surface 201a and the second principal surface 201b, is the Z direction. The X direction is a direction in which the electrode fingers 3 and 4 of the interdigital transducer electrode are arranged. The Lamb waves propagate in the X direction, as illustrated in FIG. 3A. Although the entire piezoelectric layer 201 vibrates, the Lamb waves, which are plate waves, propagate in the X direction. Reflectors are thus provided on both sides to produce resonance characteristics. This causes wave propagation loss and results in a low Q factor when the number of pairs of the electrode fingers 3 and 4 is reduced for size reduction.

In the acoustic wave device of the first preferred embodiment, as illustrated in FIG. 3B, vibration displacement occurs in the thickness shear direction. Therefore, the waves propagate substantially in the direction connecting the first principal surface 2a and the second principal surface 2b of the piezoelectric layer 2, that is, substantially in the Z direction and resonate. In other words, the X direction component of the waves is much smaller than the Z direction component of the waves. Since the wave propagation in the Z direction produces resonance characteristics, the acoustic wave device requires no reflectors. This prevents propagation loss that occurs during propagation to reflectors. Therefore, the Q factor does not decrease easily even if the number of electrode pairs, each including the electrode fingers 3 and 4, is reduced for the purpose of size reduction.

As illustrated in FIG. 4, the amplitude direction of first-order thickness shear mode bulk waves in a first region 251 is opposite that in a second region 252. The first region 251 and the second region 252 are included in the excitation region C (see FIG. 1B) of the piezoelectric layer 2. FIG. 4 schematically illustrates how bulk waves behave when a voltage that makes the potential of the electrode finger 4 higher than that of the electrode finger 3 is applied between the electrode fingers 3 and 4. In the excitation region C, the first region 251 is a region between a virtual plane VP1 and the first principal surface 2a, and the second region 252 is a region between the virtual plane VP1 and the second principal surface 2b. The virtual plane VP1 is orthogonal to the thickness direction of the piezoelectric layer 2 and divides the piezoelectric layer 2 into two.

The acoustic wave device 1 includes at least one electrode pair including the electrode fingers 3 and 4. Since the acoustic wave device 1 is not configured to propagate waves in the X direction, it is not necessarily required that there be more than one electrode pair including the electrode fingers 3 and 4. That is, the acoustic wave device 1 simply requires at least one electrode pair.

For example, the electrode finger 3 is an electrode connected to the hot potential, and the electrode finger 4 is an electrode connected to the ground potential. Alternatively, the electrode finger 3 and the electrode finger 4 may be connected to the ground potential and the hot potential, respectively. In the first preferred embodiment, the at least one electrode pair is a combination of electrodes, one connected to the hot potential and the other connected to the ground potential, as described above, and no floating electrode is provided.

Figure 5:
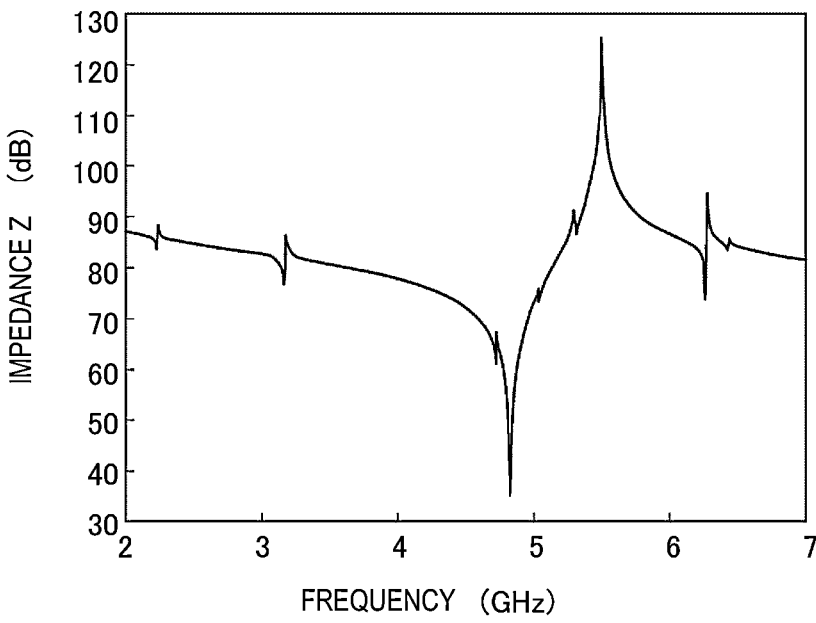
FIG. 5 is an explanatory diagram illustrating an example of resonance characteristics of the acoustic wave device according to the first preferred embodiment of the present invention.

FIG. 5 is an explanatory diagram illustrating an example of resonance characteristics of the acoustic wave device according to the first preferred embodiment. The design parameters of the acoustic wave device 1 having the resonance characteristics illustrated in FIG. 5 are as follows.

Piezoelectric layer 2: LiNbO₃ with Euler angles (0°, 0°, 90°)

Thickness of piezoelectric layer 2: 400 nm

Length of excitation region C (see FIG. 1B): 40 μm

Number of electrode pairs, each including electrode fingers 3 and 4: 21 pairs Center-to-center distance (pitch) between electrode fingers 3 and 4: 3 μm Width of electrode fingers 3 and 4: 500 nm d/p: 0.133

Intermediate layer 7: 1 μm-thick silicon oxide film

Support substrate 8: Si

The excitation region C (see FIG. 1B) is a region where the electrode fingers 3 and 4 overlap, as viewed in the X direction orthogonal to the length direction of the electrode fingers 3 and 4. The length of the excitation region C is a dimension of the excitation region C along the length direction of the electrode fingers 3 and 4. The excitation region C here is an example of "overlap region".

In the first preferred embodiment, all electrode pairs, each including the electrode fingers 3 and 4, have the same interelectrode distance. That is, the electrode fingers 3 and 4 are arranged with an equal pitch.

As is obvious from FIG. 5, good resonance characteristics with a fractional bandwidth of about 12.5% are obtained without reflectors.

In the first preferred embodiment, d/p is less than or equal to about 0.5 and more preferably less than or equal to about 0.24, for example, where d is the thickness of the piezoelectric layer 2 and p is the center-to-center distance between the electrode fingers 3 and 4. This will now be described with reference to FIG. 6.

Figure 6:
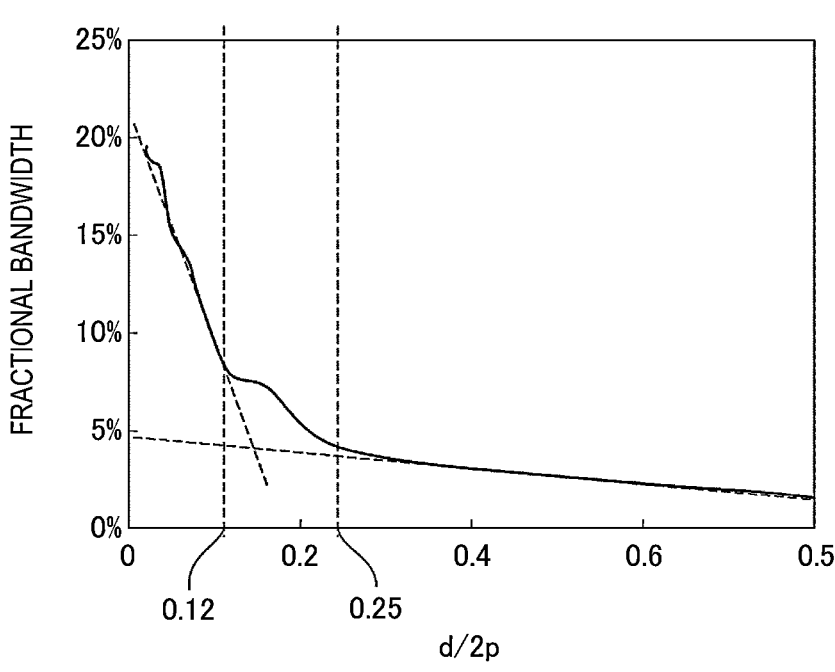
FIG. 6 is an explanatory diagram illustrating a relation between d/2p and a fractional bandwidth of the acoustic wave device of the first preferred embodiment of the present invention defining and functioning as a resonator, where p is a center-to-center distance or average center-to-center distance between adjacent electrodes and d is an average thickness of the piezoelectric layer.

A plurality of acoustic wave devices are produced by varying d/2p of the acoustic wave device having the resonance characteristics illustrated in FIG. 5. FIG. 6 is an explanatory diagram illustrating a relation between d/2p and a fractional bandwidth of the acoustic wave device of the first preferred embodiment defining and functioning as a resonator, where p is the center-to-center distance between adjacent electrodes or the average center-to-center distance between adjacent electrodes, and d is the average thickness of the piezoelectric layer 2.

As illustrated in FIG. 6, if d/2p exceeds about 0.25 (or d/p>about 0.5), the fractional bandwidth falls below about 5% even when d/p is adjusted. On the other hand, if d/2p ≤ about 0.25 (or d/p≤about 0.5), the fractional bandwidth can be made greater than or equal to about 5% by varying d/p within the range, that is, a resonator having a high coupling coefficient can be obtained. If d/2p is less than or equal to about 0.12, that is, if d/p is less than or equal to about 0.24, the fractional bandwidth can be made as high as about 7% or more. Additionally, by varying d/p within this range, a resonator with a wider fractional bandwidth and a higher coupling coefficient can be produced. Thus, by making d/p less than or equal to about 0.5, a resonator with a higher coupling coefficient using first-order thickness shear mode bulk waves can be obtained.

It is simply preferable that there be at least one electrode pair. In the case of one electrode pair, p is the center-to-center distance between adjacent electrode fingers 3 and 4. In the case of greater than or equal to 1.5 electrode pairs, p may be the average center-to-center distance between adjacent electrode fingers 3 and 4.

If the piezoelectric layer 2 varies in thickness, the average thickness of the piezoelectric layer 2 may be used as the thickness d of the piezoelectric layer 2.

Figure 7:
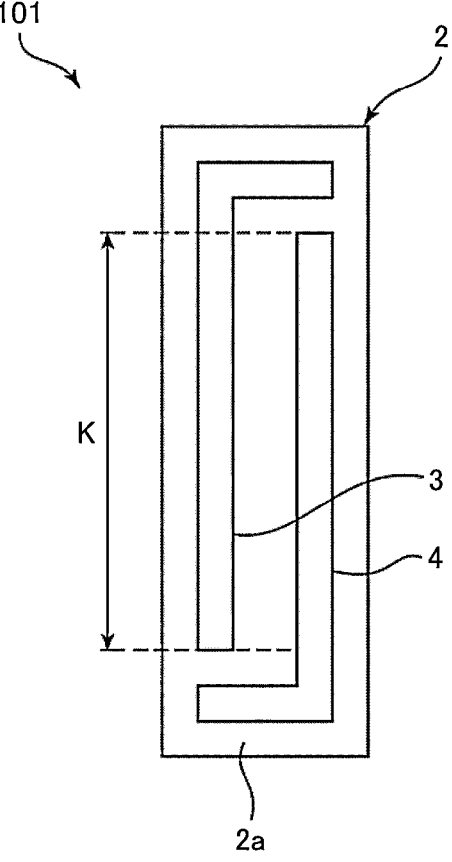
FIG. 7 is a plan view illustrating an example of one electrode pair in an acoustic wave device according to the first preferred embodiment of the present invention.

FIG. 7 is a plan view illustrating an example of one electrode pair in an acoustic wave device according to the first preferred embodiment. An acoustic wave device 101 includes one electrode pair including the electrode fingers 3 and 4 on the first principal surface 2a of piezoelectric layer 2. Note that K in FIG. 7 indicates an overlap width. As described above, the acoustic wave device according to the present disclosure may include only one electrode pair. Even in this case, the first-order thickness shear mode bulk waves can be effectively excited if d/p is less than or equal to about 0.5.

When the excitation region C is a region where any adjacent electrode fingers 3 and 4 of the plurality electrode fingers 3 and 4 overlap, as viewed in the direction in which the adjacent electrode fingers 3 and 4 face each other, it is preferable in the acoustic wave device 1 that a metallization ratio MR of the adjacent electrode fingers 3 and 4 to the excitation region C satisfy MR≤about 1.75 (d/p)+0.075. An effective reduction of spurious emission can be achieved in this case. This will be described with reference to FIG. 8 and FIG. 9.

Figure 8:
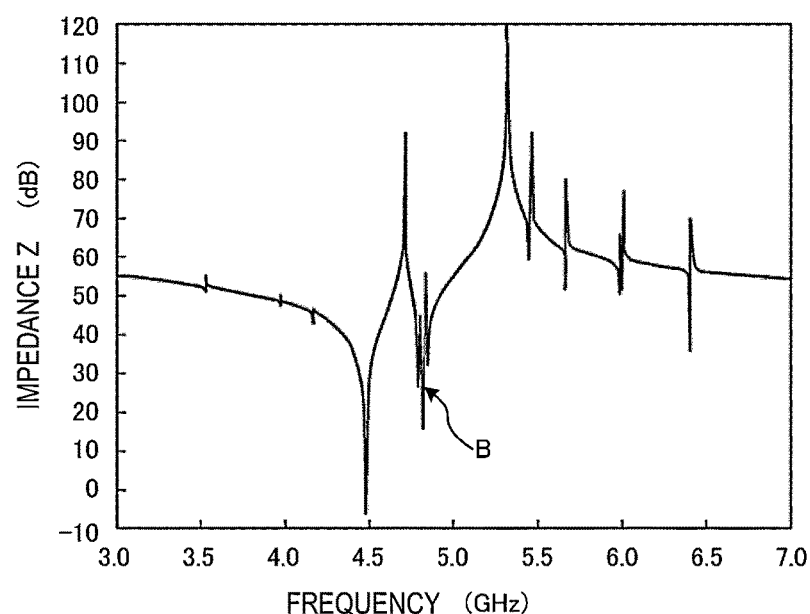
FIG. 8 is a reference diagram illustrating an example of resonance characteristics of the acoustic wave device according to the first preferred embodiment of the present invention.

FIG. 8 is a reference diagram illustrating an example of resonance characteristics of the acoustic wave device according to the first preferred embodiment. Arrow B indicates a spurious emission appearing between the resonant frequency and the anti-resonant frequency. In this example, d/p is about 0.08, LiNbO₃ has Euler angles (0°, 0°, 90°), and the metallization ratio MR is about 0.35.

The metallization ratio MR will now be described with reference to FIG. 1B. To focus on one pair of electrode fingers 3 and 4 of the electrode structure in FIG. 1B, the description assumes that only the one pair of electrode fingers 3 and 4 is provided. In this case, a region enclosed by a dash-dot line is the excitation region C. When the electrode fingers 3 and 4 are viewed in the direction orthogonal to the length direction of the electrode fingers 3 and 4, or viewed in the direction in which the electrode fingers 3 and 4 face each other, the excitation region C includes a portion of the electrode finger 3 overlapping the electrode finger 4, a portion of the electrode finger 4 overlapping the electrode finger 3, and a portion between the electrode fingers 3 and 4 where the electrode fingers 3 and 4 face each other. The metallization ratio MR is the ratio of the area of the electrode fingers 3 and 4 in the excitation region C to the area of the excitation region C. That is, the metallization ratio MR is the ratio of the area of a metallized portion to the area of the excitation region C.

When a plurality of pairs of electrode fingers 3 and 4 are provided, MR may be the ratio of the area of metallized portions included in all excitation regions C to the sum of the areas of the excitation regions C.

Figure 9:
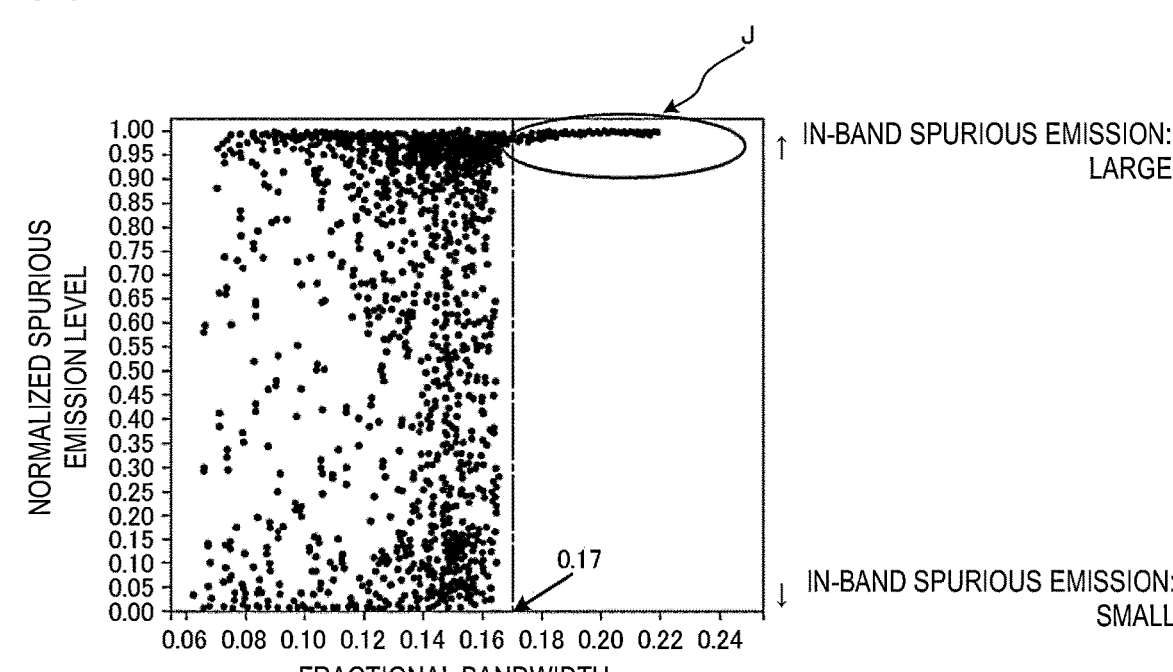
FIG. 9 is an explanatory diagram illustrating a relation between the fractional bandwidth of the acoustic wave device of the first preferred embodiment of the present invention of each of many acoustic wave resonators, and the amount of phase rotation of impedance of spurious emission normalized at 180 degrees to represent the level of spurious emission.

FIG. 9 is an explanatory diagram illustrating a relation between the fractional bandwidth of the acoustic wave device of the first preferred embodiment of each of many acoustic wave resonators, and the amount of phase rotation of impedance of spurious emission normalized at 180 degrees to represent the level of spurious emission. The fractional bandwidth is adjusted by varying the film thickness of the piezoelectric layer 2 or the dimensions of the electrode fingers 3 and 4. FIG. 9 illustrates a result of using a Z-cut LiNbO₃ layer as the piezoelectric layer 2. A similar tendency is observed when the piezoelectric layer 2 with other cut-angles is used.

In the region enclosed by oval J in FIG. 9, the level of spurious emission is as high as about 1.0. As is clear from FIG. 9, when the fractional bandwidth exceeds about 0.17 or about 17%, a large spurious emission with a spurious emission level of 1 or higher appears in the pass band even if parameters defining the fractional bandwidth are changed. That is, as in the resonance characteristics illustrated in FIG. 8, a large spurious emission indicated by arrow B appears in the band. Therefore, it is preferable that the fractional bandwidth be less than or equal to about 17%. In this case, adjusting the film thickness of the piezoelectric layer 2 or the dimensions of the electrode fingers 3 and 4 can reduce or prevent spurious emission.

Figure 10:
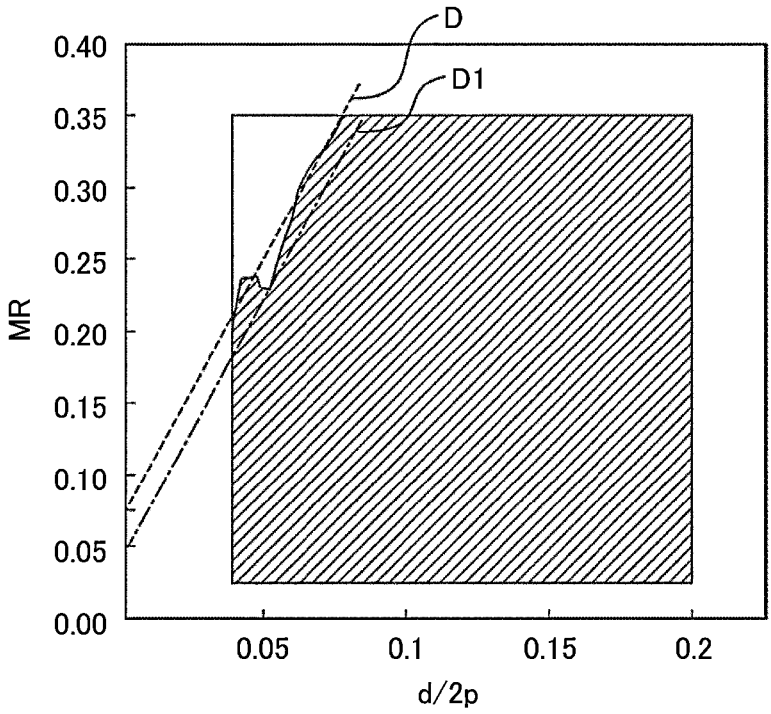
FIG. 10 is an explanatory diagram illustrating a relation between d/2p, metallization ratio MR, and fractional bandwidth.

FIG. 10 is an explanatory diagram illustrating a relation between d/2p, metallization ratio MR, and fractional bandwidth. Various acoustic wave devices 1 of the first preferred embodiment are made by varying d/2p and MR to measure the fractional bandwidths. In FIG. 10, a hatched region to the right of broken line D is a region where the fractional bandwidth is less than or equal to about 17%. The boundary between the hatched and non-hatched regions is represented by MR=about 3.5(d/2p)+0.075 or MR=about 1.75(d/p)+0.075, and preferably MR≤about 1.75(d/p)+0.075. In this case, it is easier to make the fractional bandwidth less than or equal to about 17%. A more preferable region is one that is to the right of the boundary represented by MR=about 3.5(d/2p)+0.05, indicated by dash-dot line D1 in FIG. 10. That is, if MR≤about 1.75(d/p)+0.05 is satisfied, the fractional bandwidth can be reliably made less than or equal to about 17%.

Figure 11:
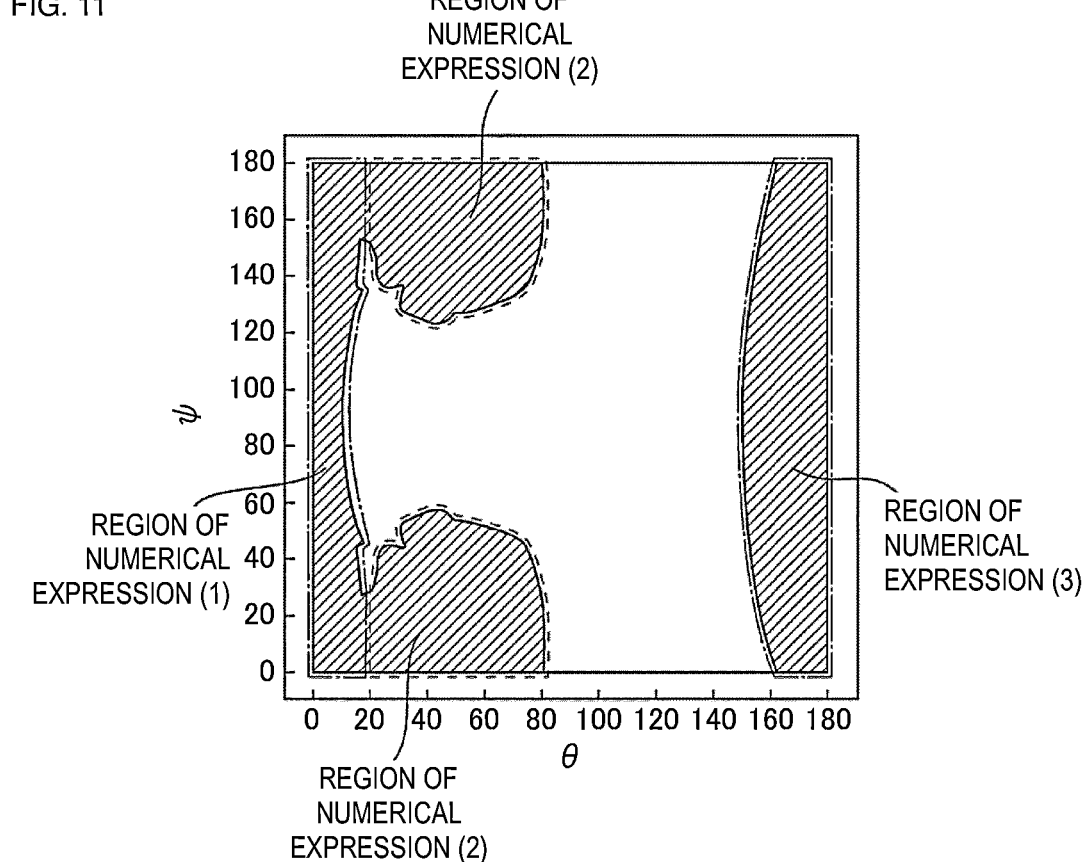
FIG. 11 is an explanatory diagram illustrating a map of fractional bandwidth with respect to Euler angles (0', θ, ψ) of LiNbO$_3$ obtained when d/p is brought as close as possible to 0.

FIG. 11 is an explanatory diagram illustrating a map of fractional bandwidth with respect to Euler angles (0°, θ, ψ) of LiNbO₃ obtained when d/p is brought as close as possible to 0. Hatched regions in FIG. 11 are regions where a fractional bandwidth of at least greater than or equal to about 5% can be obtained. By approximating the ranges of these regions, ranges defined by numerical expression (1), numerical expression (2) and numerical expression (3) described below are obtained.

$$(0°±10°, 0° \text{ to } 20°, \text{any } \psi) \quad \text{numerical expression (1)}$$

$$(0°±10°, 20° \text{ to } 80°, 0° \text{ to } 60°(1-(\theta-50)^2/900)^{1/2}) \text{ or}$$
$$(0°±10°, 20° \text{ to } 80°, [180°-60°(1-(\theta-50)^2/900)^{1/2}] \text{ to } 180°) \quad \text{numerical expression (2)}$$

$$(0°±10°, [180°-30°(1-(\psi-90)^2/8100)^{1/2}] \text{ to } 180°, \text{any } \psi) \quad \text{numerical expression (3)}$$

The ranges of the Euler angles defined by numerical expression (1), numerical expression (2), or numerical expression (3) are preferable, because a sufficiently wide fractional bandwidth can be achieved.

Figure 12:
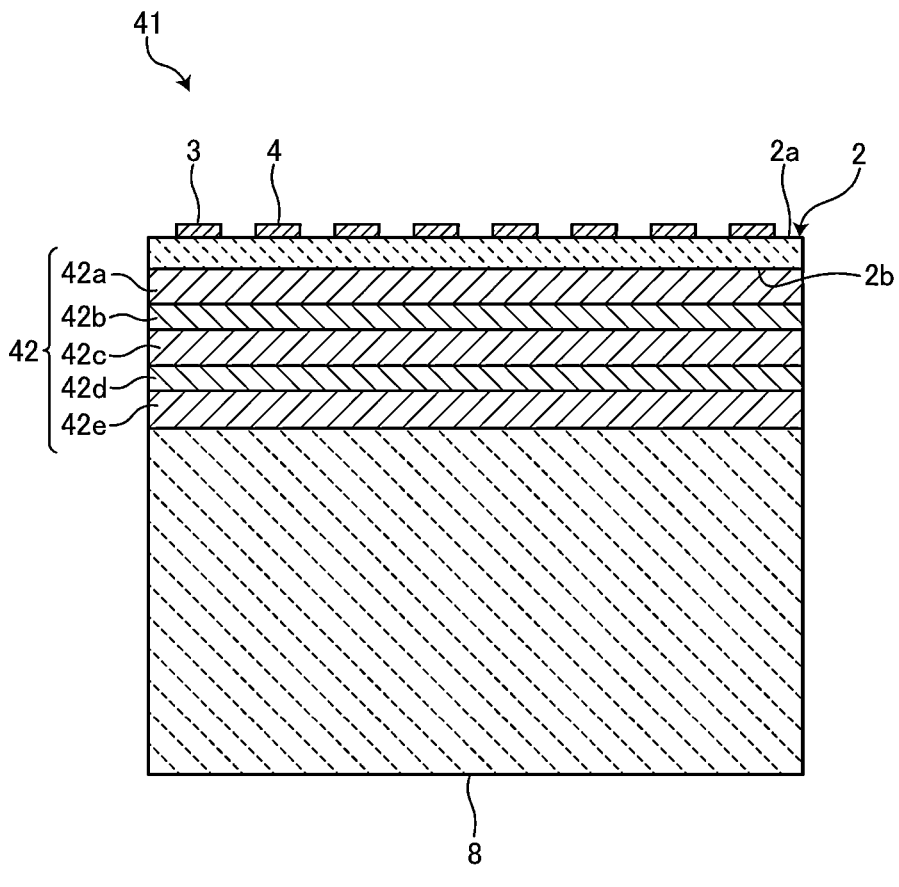
FIG. 12 is a cross-sectional view taken along line II-II of FIG. 1A and illustrating a modification of the first preferred embodiment of the present invention.

FIG. 12 is a cross-sectional view taken along line II-II of FIG. 1A and illustrating a modification of the first preferred embodiment. An acoustic wave device 41 includes an acoustic multilayer film 42 on the second principal surface 2b of the piezoelectric layer 2. The acoustic multilayer film 42 has a multilayer structure of low acoustic impedance layers 42a, 42c, and 42e with a relatively low acoustic impedance, and high acoustic impedance layers 42b and 42d with a relatively high acoustic impedance. The low acoustic impedance layers are, for example, SiO₂ layers, whereas high acoustic impedance layers are, for example, metal layers such as W or Pt layers, or dielectric layers such as AlN or SiN layers. The acoustic multilayer film 42 can confine first-order thickness shear mode bulk waves in the piezoelectric layer 2 without using the air gap 9 in the acoustic wave device 1. When d/p is less than or equal to about 0.5, the acoustic wave device 41 can have resonance characteristics based on first-order thickness shear mode bulk waves. In the acoustic multilayer film 42, the number of the low acoustic impedance layers 42a, 42c, and 42e and the number of the high acoustic impedance layers 42b and 42d are not particularly limited. It is simply preferred that at least one of the high acoustic impedance layers 42b and 42d be disposed farther from the piezoelectric layer 2 than a corresponding one of the low acoustic impedance layers 42a, 42c, and 42e.

The low acoustic impedance layers 42a, 42c, and 42e and the high acoustic impedance layers 42b and 42d may be made of any appropriate materials that allow the relation between the acoustic impedances described above to be satisfied. For example, the low acoustic impedance layers 42a, 42c, and 42e may be made of silicon oxide or silicon oxynitride. The high acoustic impedance layers 42b and 42d may be made of alumina, silicon nitride, or metal.

Figure 13:
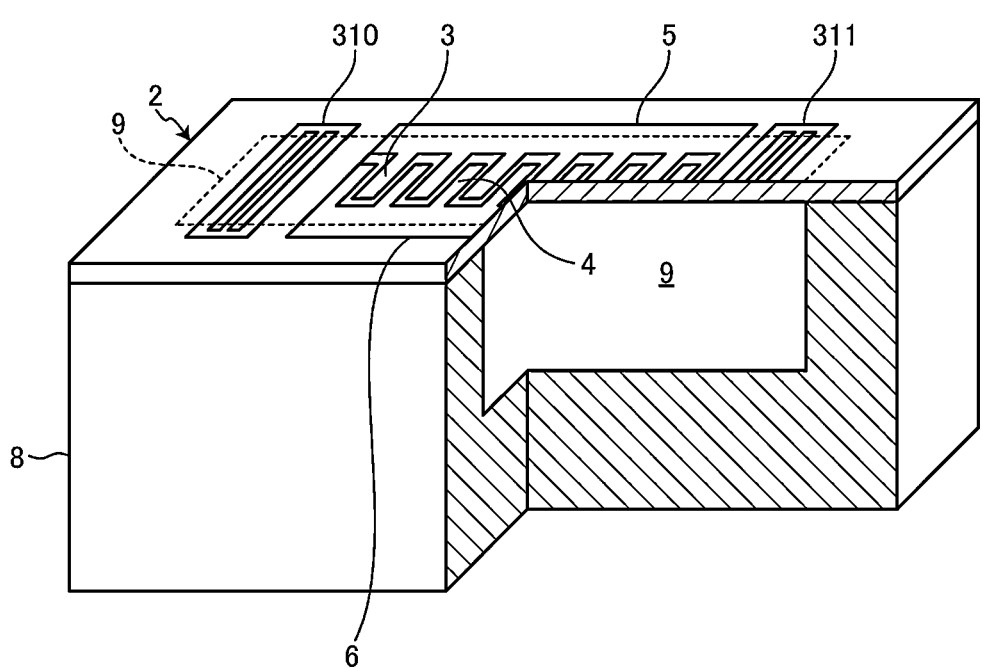
FIG. 13 is a partial cutaway perspective view for explaining an acoustic wave device according to a preferred embodiment of the present invention.

FIG. 13 is a partial cutaway perspective view for explaining an acoustic wave device according to a preferred embodiment of the present disclosure. In FIG. 13, the outer edge of the air gap 9 is indicated by a broken line. Acoustic wave devices according to preferred embodiments of the present disclosure may use plate waves. In this case, an acoustic wave device 301 includes reflectors 310 and 311, as illustrated in FIG. 13. The reflectors 310 and 311 are disposed on both sides of the electrode fingers 3 and 4 on the piezoelectric layer 2 in the propagation direction of acoustic waves. In the acoustic wave device 301, Lamb waves (or plate waves) are excited by applying an alternating-current electric field to the electrode fingers 3 and 4 above the air gap 9. With the reflectors 310 and 311 on both sides, the resonance characteristics based on Lamb waves (or plate waves) can be obtained.

As described above, the acoustic wave devices 1 and 101 use first-order thickness shear mode bulk waves. In the acoustic wave devices 1 and 101, the first and second electrode fingers 3 and 4 are adjacent electrodes and d/p is less than or equal to about 0.5, where d is the thickness of the piezoelectric layer 2 and p is the center-to-center distance between the first and second electrode fingers 3 and 4. This can improve the Q factor even when the acoustic wave device is reduced in size.

In the acoustic wave devices 1 and 101, the piezoelectric layer 2 is made of lithium niobate or lithium tantalate. The first principal surface 2a or the second principal surface 2b of the piezoelectric layer 2 has thereon the first and second electrode fingers 3 and 4 facing each other in the direction crossing the thickness direction of the piezoelectric layer 2. The first and second electrode fingers 3 and 4 are preferably covered with a protective layer.

Figure 14:
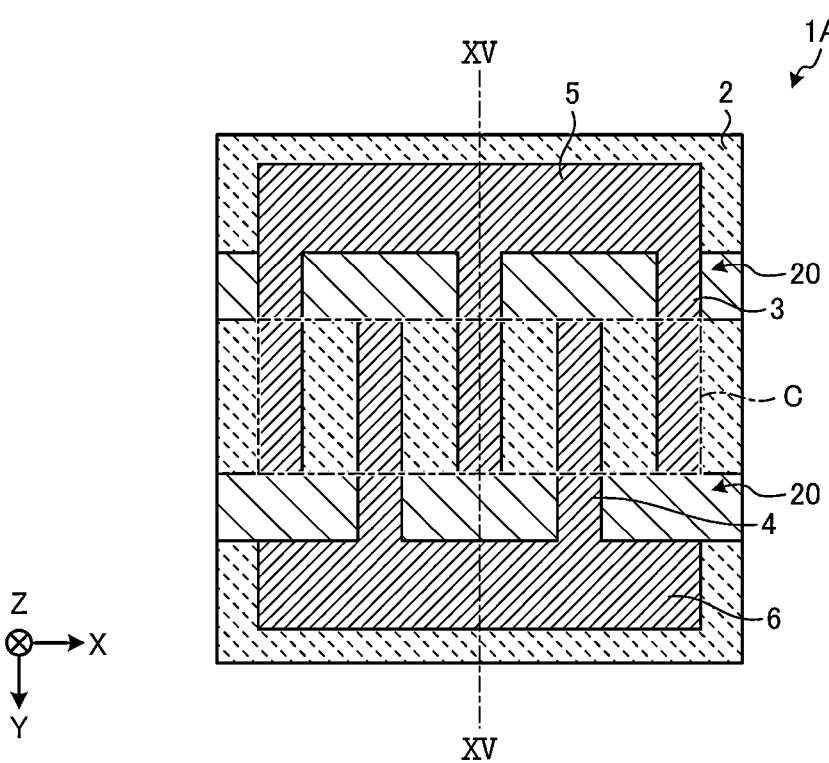
FIG. 14 is a plan view illustrating an example of the acoustic wave device according to the first preferred embodiment of the present invention.
Figure 15:
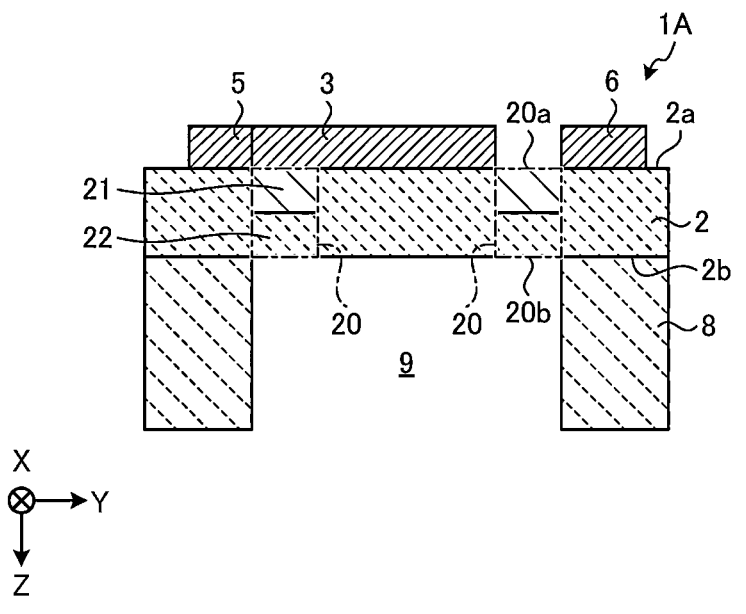
FIG. 15 is a cross-sectional view taken along line XV-XV of FIG. 14.

FIG. 14 is a plan view illustrating an example of the acoustic wave device according to the first preferred embodiment. FIG. 15 is a cross-sectional view taken along line XV-XV of FIG. 14. An acoustic wave device 1A according to the first preferred embodiment includes the piezoelectric layer 2, an interdigital transducer electrode including the electrode fingers 3 and 4 and the busbar electrodes 5 and 6, and a support member. Of directions parallel to the Z direction, a direction from the second principal surface 2b toward the first principal surface 2a of the piezoelectric layer 2 may hereinafter be described as an upward direction, and a direction from the first principal surface 2a toward the second principal surface 2b of the piezoelectric layer 2 may hereinafter be described as a downward direction.

The support member is a component that includes the support substrate 8. In the first preferred embodiment, the support member is defined by the support substrate 8. In the first preferred embodiment, the piezoelectric layer 2 is disposed in the Z direction of the support substrate 8. The support member may further include an intermediate layer 7 in the Z direction of the support substrate 8. The support member has the air gap 9 that partially overlaps the interdigital transducer electrode, in plan view in the Z direction. In the example illustrated in FIG. 15, the air gap 9 penetrates the support substrate 8 in the Z direction. This is merely an example and the air gap 9 may occupy only one side of the support member adjacent to the piezoelectric layer 2.

The piezoelectric layer 2 is disposed in the Z direction of the support member. In the first preferred embodiment, the piezoelectric layer 2 is a layer including piezoelectric lithium niobate and unavoidable impurities. For example, the piezoelectric layer 2 is a single-crystal Z-cut lithium niobate layer. In the example illustrated in FIG. 14 and FIG. 15, the direction of dielectric polarization of the piezoelectric layer 2 in the overlap region C is upward. Here, the direction of dielectric polarization refers to the direction of a polarization vector generated by dielectric polarization. In the overlap region C, therefore, the first principal surface 2a of the piezoelectric layer 2 is a surface (dielectric positive potential surface) having a positive potential applied thereto by dielectric polarization, and the second principal surface 2b of the piezoelectric layer 2 is a surface (dielectric negative potential surface) having a negative potential applied thereto by dielectric polarization.

In the acoustic wave device using first-order thickness shear mode bulk waves, there is a possibility of leakage of acoustic waves from the surface of the piezoelectric layer 2. The degree of leakage of acoustic waves increases in the direction (Y direction) in which the electrode fingers 3 and 4 extend. If the piezoelectric layer 2 is a Z-cut layer with a second Euler angle θ of greater than or equal to about −15° and less than or equal to about +15°, for example, there is an increased possibility of leakage of acoustic waves.

The present inventor has discovered that in the acoustic wave device using first-order thickness shear mode bulk waves, an acoustic wave leakage mode occurs outside the overlap region C in the Y direction, and an acoustic wave leakage mode occurs inside the first busbar electrode 5 or the second busbar electrode 6 in the Y direction. Thus, as a result of studies, the present inventor has concluded that with a piezoelectric multilayer structure 20 in a gap region, the leakage of acoustic waves can be reduced or prevented. The gap region refers to a region between the first electrode finger 3 and the second busbar electrode 6 in the Y direction, or a region between the second electrode finger 4 and the first busbar electrode 5 in the Y direction. The piezoelectric multilayer structure 20 will now be described.

The piezoelectric multilayer structure 20 is a multilayer body of a plurality of piezoelectric bodies. The piezoelectric multilayer structure 20 is disposed in a gap region. Here, the gap region refers to a region between the first electrode finger 3 and the second busbar electrode 6 in the Y direction, or a region between the second electrode finger 4 and the first busbar electrode 5 in the Y direction. In the first preferred embodiment, the piezoelectric multilayer structure 20 is disposed between the overlap region C and each of the busbar electrodes 5 and 6 in the Y direction. In plan view in the Z direction, the piezoelectric multilayer structures 20 overlap the first and second electrode fingers 3 and 4. The piezoelectric multilayer structures 20 each include a first piezoelectric body 21 and a second piezoelectric body 22. The piezoelectric multilayer structure 20 does not necessarily need to be a two-layer structure, and may be a multilayer body including three or more layers of piezoelectric bodies.

The first piezoelectric body 21 and the second piezoelectric body 22 are piezoelectric bodies having different states of dielectric polarization. Having different states of dielectric polarization means that the first piezoelectric body 21 and the second piezoelectric body 22 include regions with different directions of dielectric polarization. The first piezoelectric body 21 is a piezoelectric body including a first principal surface 20a of the piezoelectric multilayer structure 20. The second piezoelectric body 22 is a piezoelectric body including a second principal surface 20b of the piezoelectric multilayer structure 20. The first piezoelectric body 21 and the second piezoelectric body 22 are made of a material having the same composition as the material of the piezoelectric layer 2 in the overlap region C. For example, the first piezoelectric body 21 and the second piezoelectric body 22 are Z-cut lithium niobate bodies. This inhibits excitation of acoustic waves in the gap region, and can reduce or prevent leakage of acoustic waves.

In the first preferred embodiment, the first piezoelectric body 21 and the second piezoelectric body 22 differ in the direction of dielectric polarization. In the example illustrated in FIG. 15, the direction of dielectric polarization of the second piezoelectric body 22 is an upward direction, which is the same as that of the piezoelectric layer 2 in the overlap region C. On the other hand, the direction of dielectric polarization of the first piezoelectric body 21 is a downward direction, which is opposite that of the second piezoelectric body 22 or the piezoelectric layer 2 in the overlap region C. Thus, both the first principal surface 20a and the second principal surface 20*b* of the piezoelectric multilayer structure 20 are dielectric negative potential surfaces, and the piezoelectric multilayer structure 20 is a bipolar multilayer body in the Z direction. This more effectively inhibits excitation of acoustic waves in the gap region, and can more effectively reduce or prevent leakage of acoustic waves.

The state of dielectric polarization of the piezoelectric multilayer structure 20 can be observed by a scanning probe microscopy (SPM). Specifically, in an image of the first principal surface 2*a* or a cross-section of an area near a gap portion, observed with a piezo response microscope (PRM), regions with different directions of dielectric polarization appear in different colors. This allows identification of the region occupied by the first piezoelectric body 21.

The acoustic wave device according to the first preferred embodiment is not limited to the acoustic wave device 1A. Modifications will now be described with reference to drawings.

Figure 16:
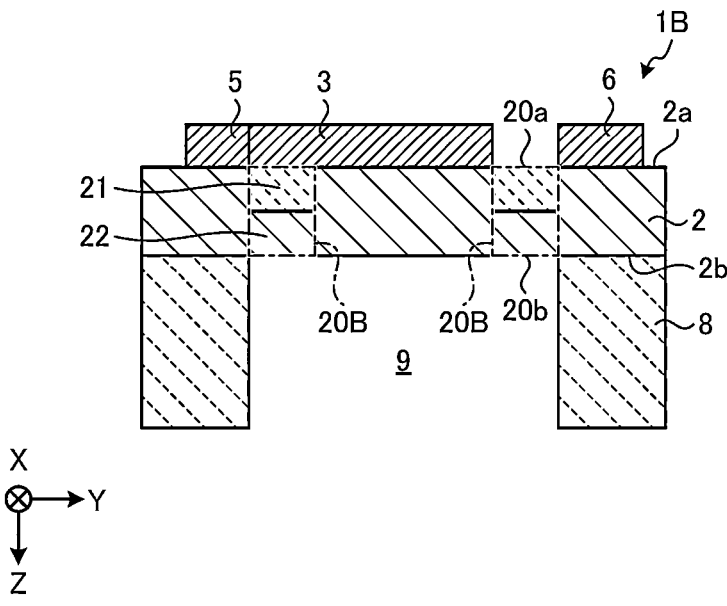
FIG. 16 is a cross-sectional view illustrating a first modification of the acoustic wave device according to the first preferred embodiment of the present invention.

FIG. 16 is a cross-sectional view illustrating a first modification of the acoustic wave device according to the first preferred embodiment. In an acoustic wave device 1B according to the first modification illustrated in FIG. 16, the direction of dielectric polarization of the first piezoelectric body 21 is downward, and the direction of dielectric polarization of the second piezoelectric body 22 and the piezoelectric layer 2 in the overlap region C is upward. Thus, both the first principal surface 20*a* and the second principal surface 20*b* of a piezoelectric multilayer structure 20B are dielectric positive potential surfaces. This also inhibits excitation of acoustic waves in the gap region, and can reduce or prevent leakage of acoustic waves.

Figure 17:
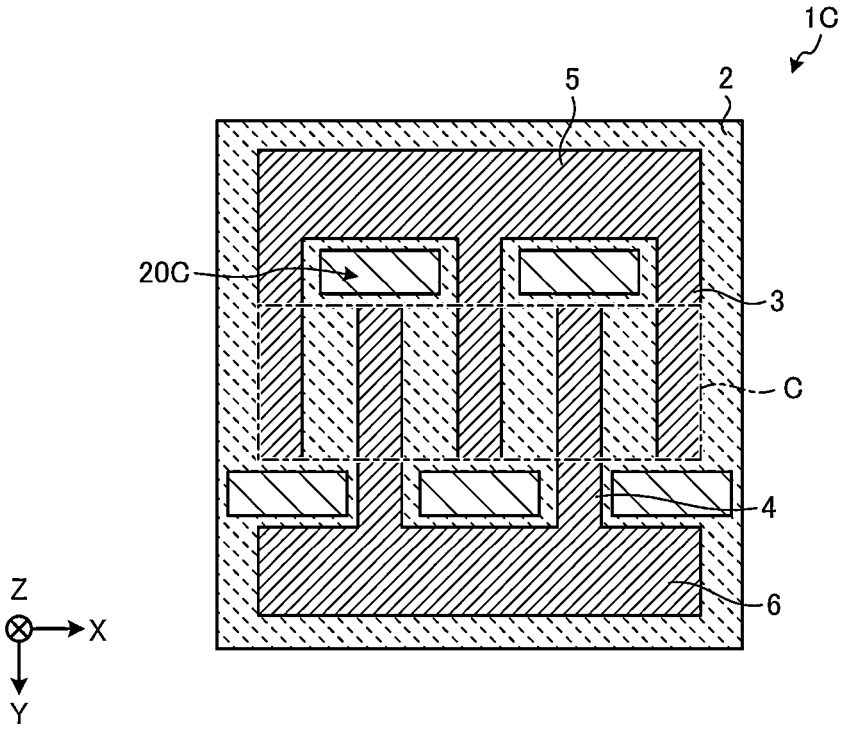
FIG. 17 is a plan view illustrating a second modification of the acoustic wave device according to the first preferred embodiment of the present invention.

FIG. 17 is a plan view illustrating a second modification of the acoustic wave device according to the first preferred embodiment. In an acoustic wave device 1C according to the second modification illustrated in FIG. 17, piezoelectric multilayer structures 20C are spaced apart in the X direction. In the example illustrated in FIG. 17, the piezoelectric multilayer structures 20C do not overlap the electrode fingers 3 and 4 in plan view in the Z direction. This also inhibits excitation of acoustic waves in the gap region, and can reduce or prevent leakage of acoustic waves.

Figure 18:
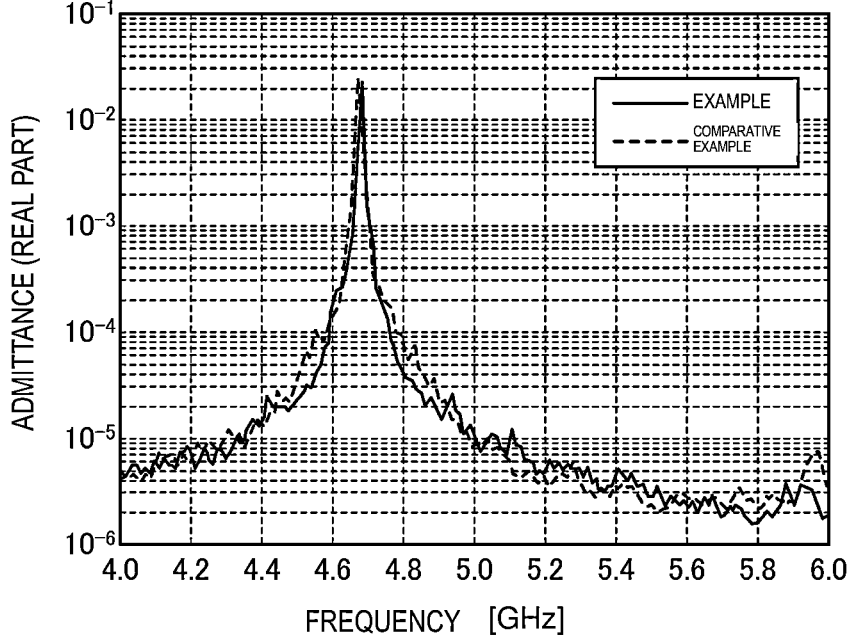
FIG. 18 is an explanatory diagram illustrating an example of admittance characteristics of the acoustic wave device according to the first preferred embodiment of the present invention.
Figure 19:
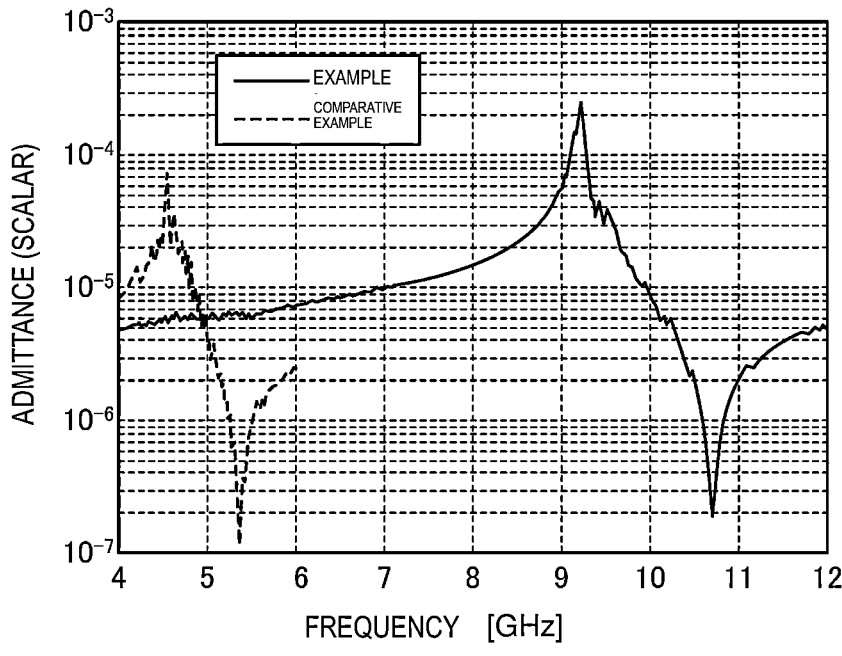
FIG. 19 is an explanatory diagram illustrating an example of admittance characteristics of the acoustic wave device according to the first preferred embodiment of the present invention.

FIG. 18 is an explanatory diagram illustrating an example of admittance characteristics of the acoustic wave device according to the first preferred embodiment. FIG. 19 is an explanatory diagram illustrating an example of admittance characteristics of the acoustic wave device according to the first preferred embodiment. Specifically, FIG. 18 is an explanatory diagram illustrating the real part of admittance, or conductance, of the acoustic wave device according to the first preferred embodiment. Also, FIG. 19 is an explanatory diagram illustrating, for only a mode that occurs in the gap region, the scalar of admittance (or quantity of admittance) of the acoustic wave device according to the first preferred embodiment. In FIG. 18 and FIG. 19, Example represents a result of simulation of the acoustic wave device 1A according to the first preferred embodiment, and Comparative Example represents a result of simulation of an acoustic wave device without the piezoelectric multilayer structure 20. As illustrated in FIG. 18, the acoustic wave device according to Example has a narrower peak width of the resonant frequency than the acoustic wave device according to Comparative Example. This reduces propagation loss and reduces or prevents leakage of acoustic waves. As illustrated in FIG. 19, in the acoustic wave device according to Comparative Example, a mode derived from leakage of acoustic waves occurs in the 4 GHz to 6 GHz band. In the acoustic wave device according to Example, on the other hand, a mode derived from leakage of acoustic waves does not occur in the 4 GHz to 6 GHz band (or pass band), but occurs in the 8 GHz to 12 GHz band. In the acoustic wave device according to Example, a mode derived from leakage of acoustic waves, occurring in the gap region, is not coupled to a principal wave mode occurring in the overlap region C. This can confine acoustic waves in the planar direction, and can reduce or prevent leakage of acoustic waves.

As described above, the acoustic wave device 1A according to the first preferred embodiment includes the support member including the support substrate 8 having a thickness in the first direction, the piezoelectric layer 2 disposed in the first direction of the support member, and the interdigital transducer electrode disposed on the principal surface of the piezoelectric layer 2. The interdigital transducer electrode includes the plurality of first electrode fingers 3 extending in the second direction crossing the first direction, the first busbar electrode 5 connected to the plurality of first electrode fingers 3, the plurality of second electrode fingers 4 extending in the second direction and facing corresponding ones of the plurality of first electrode fingers 3 in the third direction orthogonal to the second direction, and the second busbar electrode 6 connected to the plurality of second electrode fingers 4. The piezoelectric layer 2 includes the piezoelectric multilayer structure 20 in the gap region between at least one first electrode finger 3 and the second busbar electrode 6, or between at least one second electrode finger 4 and the first busbar electrode 5, in plan view in the first direction. The piezoelectric multilayer structure 20 includes the first piezoelectric body 21 and the second piezoelectric body 22 having a different state of dielectric polarization from the first piezoelectric body 21.

This inhibits excitation of acoustic waves in the gap region, reduces or prevents the occurrence of acoustic wave leakage mode, and thus can reduce or prevent leakage of acoustic waves.

In plan view in the first direction, the piezoelectric multilayer structure 20 overlaps the first electrode finger 3 or the second electrode finger 4. This can also reduce or prevent leakage of acoustic waves.

In plan view in the first direction, the piezoelectric multilayer structures 20 are spaced apart in the third direction. This can also reduce or prevent leakage of acoustic waves.

In plan view in the first direction, the air gap is disposed to at least partially overlap the interdigital transducer electrode. This can confine the first-order thickness shear mode bulk waves in the piezoelectric layer 2.

The support member includes the acoustic reflective layer (acoustic multilayer film 42) adjacent to the piezoelectric layer 2. The acoustic multilayer film 42 includes one or more low acoustic impedance layers 42*a*, 42*c*, and 42*e* having a lower acoustic impedance than the piezoelectric layer 2, and one or more high acoustic impedance layers 42*b* and 42*d* having a higher acoustic impedance than the piezoelectric layer 2. This can confine first-order thickness shear mode bulk waves in the piezoelectric layer 2.

The piezoelectric layer 2 in the overlap region C where the first electrode finger 3 and the second electrode finger 4 overlap, as viewed in the third direction, has the same state of dielectric polarization as the first piezoelectric body 21. This can also reduce or prevent leakage of acoustic waves.

In a preferred aspect, the direction of dielectric polarization of the first piezoelectric body 21 is opposite the direction of dielectric polarization of the second piezoelectric body 22. This can more effectively reduce or prevent leakage of acoustic waves.

The piezoelectric layer 2 is a Z-cut layer, and the second Euler angle θ of the piezoelectric layer 2 is greater than or equal to about −15° and less than or equal to about 15°, for example. This can also reduce or prevent leakage of acoustic waves.

In a preferred aspect, the thickness of the piezoelectric layer 2 is less than or equal to 2p, where p is the center-to-center distance between adjacent first and second electrode fingers 3 and 4 of the plurality of first and second electrode fingers 3 and 4. This can reduce the size of the acoustic wave device 1 and improve the Q factor.

In a preferred aspect, the piezoelectric layer 2 contains lithium niobate or lithium tantalate. This can provide an acoustic wave device having good resonance characteristics.

In a preferred aspect, the acoustic wave device is configured to be capable of using thickness shear mode bulk waves. This improves the coupling coefficient and can provide an acoustic wave device having good resonance characteristics.

In a preferred aspect, d/p≤about 0.5 is satisfied, where d is the thickness of the piezoelectric layer 2 and p is the center-to-center distance between adjacent first and second electrode fingers 3 and 4 of the plurality of first and second electrode fingers 3 and 4. This can reduce the size of the acoustic wave device 1 and improve the Q factor.

In a more preferred aspect, d/p is less than or equal to about 0.24. This can reduce the size of the acoustic wave device 1 and improve the Q factor.

In a preferred aspect, when a region where the first electrode fingers 3 and 4 overlap as viewed in the third direction is the excitation region C, MR≤about 1.75(d/p)+0.075 is satisfied, where MR is the metallization ratio of the first and second electrode fingers 3 and 4 to the excitation region C. This can reliably make the fractional bandwidth less than or equal to about 17%.

In a preferred aspect, the piezoelectric layer 2 is made of lithium niobate or lithium tantalate, and Euler angles (φ, θ, ψ) of the lithium niobate or the lithium tantalate are in the range defined by numerical expression (1), numerical expression (2), or numerical expression (3) described below. This can sufficiently widen the fractional bandwidth.

$$(0°±10°,0° \text{ to } 20°,\text{any } \psi) \qquad \text{numerical expression (1)}$$

$$(0°±10°,20° \text{ to } 80°,0° \text{ to } 60°(1-(\theta-50)^2/900)^{1/2}) \text{ or}$$
$$(0°±10°,20° \text{ to } 80°,[180°-60°(1-(\theta-50)^2/900)^{1/2}] \text{ to } 180°) \qquad \text{numerical expression (2)}$$

$$(0°±10°,[180°-30°(1-(\psi-90)^2/8100)^{1/2}] \text{ to } 180°, \text{ any } \psi) \qquad \text{numerical expression (3)}$$

Second Preferred Embodiment

Figure 20:
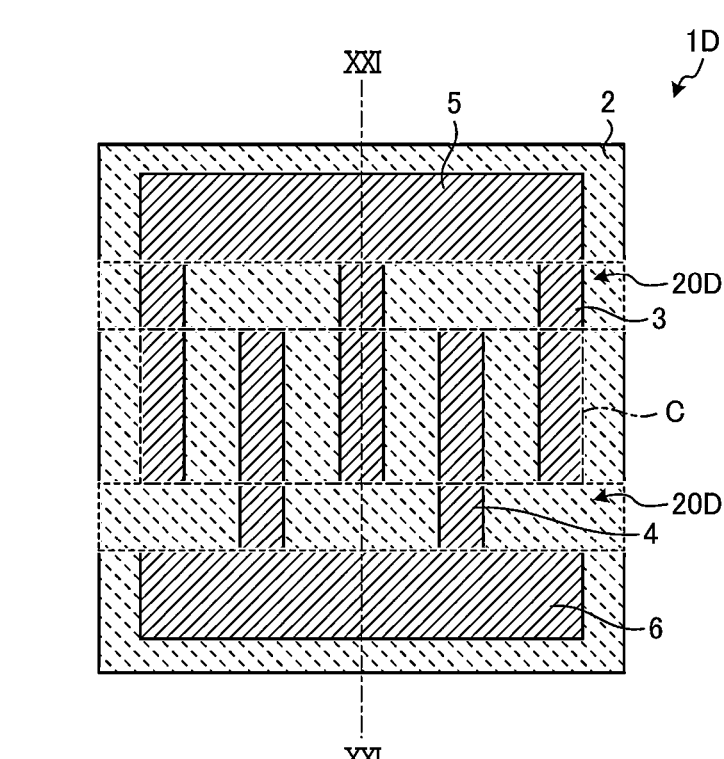
FIG. 20 is a plan view illustrating an example of an acoustic wave device according to a second preferred embodiment of the present invention.
Figure 21:
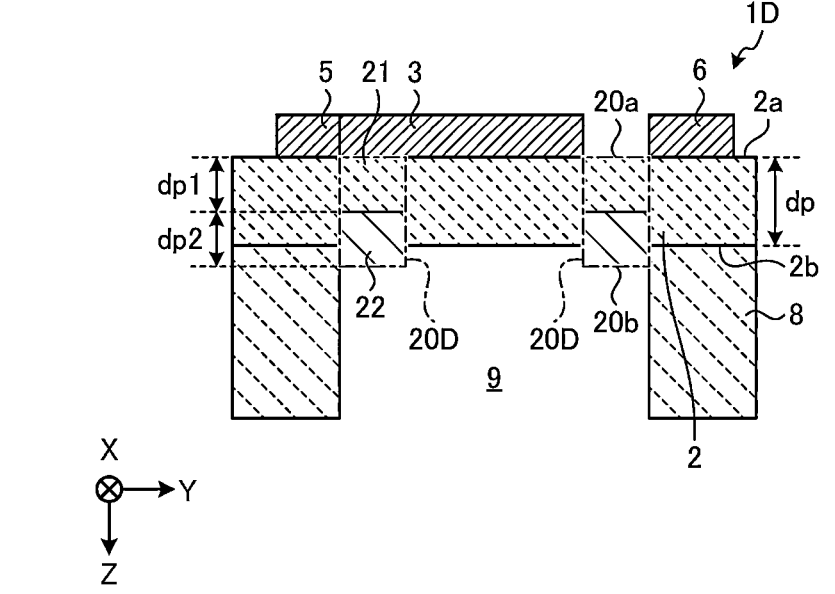
FIG. 21 is a cross-sectional view taken along line XXI-XXI of FIG. 20.

FIG. 20 is a plan view illustrating an example of an acoustic wave device according to a second preferred embodiment. FIG. 21 is a cross-sectional view taken along line XXI-XXI of FIG. 20. An acoustic wave device 1D according to the second preferred embodiment will be described with reference to the drawings. Note that the description of the same components as those of the acoustic wave device 1A according to the first preferred embodiment will be omitted by assigning reference numerals.

As illustrated in FIG. 21, the thickness of a piezoelectric multilayer structure 20D differs from the thickness of the piezoelectric layer 2 in the overlap region C. In the following description, the thickness of the first piezoelectric layer may be denoted by dp1, the thickness of the second piezoelectric layer may be denoted by dp2, and the thickness of the piezoelectric layer 2 in the overlap region C may be denoted by dp.

The thickness (dp1+dp2) of the piezoelectric multilayer structure 20D is greater than or equal to about 0.1 times the thickness dp of the piezoelectric layer 2 in the overlap region C. With this range, leakage of acoustic waves can be sufficiently reduced or prevented.

The thickness (dp1+dp2) of the piezoelectric multilayer structure 20D is less than or equal to twice the thickness dp of the piezoelectric layer 2 in the overlap region C. This can prevent a mode derived from leakage of acoustic waves from shifting toward low frequencies, and reduce or prevent coupling of the mode to principal waves generated in the overlap region C.

In the acoustic wave device 1D, the thickness (dp1+dp2) of the piezoelectric multilayer structure 20D is greater than or equal to the thickness dp of the piezoelectric layer 2 in the overlap region C. Thus, the excitation mode of the piezoelectric multilayer structure 20D occurs at a frequency higher than that at which the excitation mode of the piezoelectric layer 2 in the overlap region C occurs. In the example illustrated in FIG. 18, the second principal surface 20b of the piezoelectric multilayer structure 20D is lower in height (or position in the Z direction) than the second principal surface 2b of the piezoelectric layer 2.

In the acoustic wave device 1D, the direction of dielectric polarization of the first piezoelectric body 21 is an upward direction, which is the same as that of the piezoelectric layer 2 in the overlap region C. On the other hand, the direction of dielectric polarization of the second piezoelectric body 22 is a downward direction, which is opposite that of the first piezoelectric body 21 or the piezoelectric layer 2 in the overlap region C. Thus, both the first principal surface 20a and the second principal surface 20b of the piezoelectric multilayer structure 20D are dielectric positive potential surfaces, and the piezoelectric multilayer structure 20D is a bipolar multilayer body in the Z direction. This more effectively inhibits excitation of acoustic waves in the gap region, and can more effectively reduce or prevent leakage of acoustic waves.

In the acoustic wave device 1D, the thickness dp1 of the first piezoelectric body 21 and the thickness dp2 of the second piezoelectric body 22 are equal. The thickness dp1 of the first piezoelectric body 21 and the thickness dp2 of the second piezoelectric body 22 may be different.

As described above, in the acoustic wave device 1D according to the second preferred embodiment, the piezoelectric layer 2 in the overlap region C where the first and second electrode fingers 3 and 4 overlap, as viewed in the third direction, has the same state of dielectric polarization as the second piezoelectric body 22. This can also reduce or prevent leakage of acoustic waves.

The thickness of the piezoelectric multilayer structure 20D is less than twice the thickness of the piezoelectric layer 2. This can prevent a mode derived from leakage of acoustic waves from shifting toward low frequencies, and reduce or prevent coupling of the mode to principal waves generated in the overlap region C.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate with a thickness in a first direction;
a piezoelectric layer extending on the support in the first direction; and
an interdigital transducer electrode on a principal surface of the piezoelectric layer, the interdigital transducer electrode including a plurality of first electrode fingers extending in a second direction crossing the first direction, a first busbar electrode connected to the plurality of first electrode fingers, a plurality of second electrode fingers extending in the second direction and facing corresponding ones of the plurality of first electrode fingers in a third direction perpendicular or substantially perpendicular to the second direction, and a second busbar electrode connected to the plurality of second electrode fingers; wherein
the piezoelectric layer includes a piezoelectric multilayer structure in a gap region between at least one first electrode finger and the second busbar electrode, or between at least one second electrode finger and the first busbar electrode, in plan view in the first direction;
the piezoelectric multilayer structure includes a first piezoelectric body and a second piezoelectric body with different dielectric polarizations.

2. The acoustic wave device according to claim 1, wherein in plan view in the first direction, the piezoelectric multilayer structure overlaps the first electrode finger or the second electrode finger.

3. The acoustic wave device according to claim 1, wherein in plan view in the first direction, the piezoelectric multilayer structures are spaced apart in the third direction.

4. The acoustic wave device according to claim 1, wherein in plan view in the first direction, an air gap at least partially overlaps the interdigital transducer electrode.

5. The acoustic wave device according to claim 1, wherein the support includes an acoustic reflective layer adjacent to the piezoelectric layer, the acoustic reflective layer including one or more low acoustic impedance layers with a lower acoustic impedance than the piezoelectric layer and one or more high acoustic impedance layers with a higher acoustic impedance than the piezoelectric layer.

6. The acoustic wave device according to claim 1, wherein the piezoelectric layer in an overlap region has a same state of dielectric polarization as the first piezoelectric body, the overlap region being a region where the first electrode finger and the second electrode finger overlap, as viewed in the third direction.

7. The acoustic wave device according to claim 1, wherein the piezoelectric layer in an overlap region has a same state of dielectric polarization as the second piezoelectric body, the overlap region being a region where the first electrode finger and the second electrode finger overlap, as viewed in the third direction.

8. The acoustic wave device according to claim 1, wherein a direction of dielectric polarization of the first piezoelectric body is opposite to a direction of dielectric polarization of the second piezoelectric body.

9. The acoustic wave device according to claim 1, wherein a thickness of the piezoelectric multilayer structure is less than twice a thickness of the piezoelectric layer.

10. The acoustic wave device according to claim 1, wherein
the piezoelectric layer is a Z-cut layer; and
a second Euler angle θ of the piezoelectric layer is greater than or equal to about −15° and less than or equal to about 15°.

11. The acoustic wave device according to claim 1, wherein a thickness of the piezoelectric layer is less than or equal to 2p, where p is a center-to-center distance between adjacent first and second electrode fingers of the plurality of first and second electrode fingers.

12. The acoustic wave device according to claim 1, wherein the piezoelectric layer includes lithium niobate or lithium tantalate.

13. The acoustic wave device according to claim 1, wherein the acoustic wave device is operable to generate thickness shear mode bulk waves.

14. The acoustic wave device according to claim 1, wherein d/p≤about 0.5 is satisfied, where d is a thickness of the piezoelectric layer and p is a center-to-center distance between adjacent first and second electrode fingers of the plurality of first and second electrode fingers.

15. The acoustic wave device according to claim 14, wherein d/p is less than or equal to about 0.24.

16. The acoustic wave device according to claim 1, wherein when a region where the first electrode finger and the second electrode finger overlap as viewed in the third direction is an excitation region, MR≤about 1.75(d/p)+0.075 is satisfied, where MR is a metallization ratio of the first electrode finger and the second electrode finger to the excitation region.

17. The acoustic wave device according to claim 1, wherein the piezoelectric layer is made of lithium niobate or lithium tantalate, and Euler angles (φ, θ, ψ) of the lithium niobate or the lithium tantalate are in a range defined by numerical expression (1), numerical expression (2), or numerical expression (3):

$$(0°±10°,0° \text{ to } 20°, \text{any } ψ) \qquad \text{numerical expression (1)}$$

$$(0°±10°,20° \text{ to } 80°,0° \text{ to } 60°(1-(θ-50)^2/900)^{1/2}) \text{ or}$$
$$(0°±10°,20° \text{ to } 80°,[180°-60°(1-(θ-50)^2/900)^{1/2}] \text{ to } 180°) \qquad \text{numerical expression (2)}$$

$$(0°±10°,[180°-30°(1-(ψ-90)^2/8100)^{1/2}] \text{ to } 180°, \text{any } ψ) \qquad \text{numerical expression (3)}$$

18. The acoustic wave device according to claim 1, wherein the support further includes an intermediate layer between the piezoelectric layer and the support substrate.

19. The acoustic wave device according to claim 1, wherein each of the support substrate and the intermediate layer include cavities defining an air gap.

20. The acoustic wave device according to claim 1, wherein a thickness of the piezoelectric multilayer structure is greater than or equal to about 0.1 times a thickness of the piezoelectric layer in an overlap region.

* * * * *